(12) United States Patent
Huang et al.

(10) Patent No.: US 11,062,745 B2
(45) Date of Patent: Jul. 13, 2021

(54) FDSOI SENSE AMPLIFIER CONFIGURATION IN A MEMORY DEVICE

(71) Applicant: Taiwan Semiconductor Manufacturing Co., Ltd., Hsin-Chu (TW)

(72) Inventors: Sing-Kai Huang, Douliu (TW); Charles Chew-Yuen Young, Cupertino, CA (US); Jack Liu, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/410,231

(22) Filed: May 13, 2019

(65) Prior Publication Data
US 2020/0105313 A1    Apr. 2, 2020

Related U.S. Application Data

(60) Provisional application No. 62/737,297, filed on Sep. 27, 2018.

(51) Int. Cl.
| | |
|---|---|
| *G11C 7/06* | (2006.01) |
| *G11C 11/412* | (2006.01) |
| *H01L 27/11* | (2006.01) |
| *G11C 11/419* | (2006.01) |
| *G11C 11/418* | (2006.01) |
| *G11C 7/10* | (2006.01) |

(52) U.S. Cl.
CPC ............ *G11C 7/106* (2013.01); *G11C 11/412* (2013.01); *G11C 11/418* (2013.01); *G11C 11/419* (2013.01); *H01L 27/1104* (2013.01)

(58) Field of Classification Search
None
See application file for complete search history.

(56) References Cited

U.S. PATENT DOCUMENTS

| | | | | |
|---|---|---|---|---|
| 10,043,826 | B1* | 8/2018 | Li | H01L 21/76283 |
| 2004/0155281 | A1* | 8/2004 | Osada | H01L 29/78609 |
| | | | | 257/315 |
| 2005/0276094 | A1* | 12/2005 | Yamaoka | H01L 21/84 |
| | | | | 365/154 |
| 2007/0008027 | A1* | 1/2007 | Itoh | H03K 19/00384 |
| | | | | 327/534 |
| 2010/0271864 | A1 | 10/2010 | Itoh et al. | |

(Continued)

*Primary Examiner* — J. H. Hur
(74) *Attorney, Agent, or Firm* — Eschweiler & Potashnik, LLC

(57) ABSTRACT

Some embodiments relate to a sense amplifier. The sense amplifier includes a fully-depleted silicon on insulator (FD-SOI) substrate, including a handle substrate region, an insulator layer over the handle substrate region, and a device region over the insulator layer. An n-well region is disposed in the handle substrate region, and an n-well contact region extends from the n-well region through the insulator layer to an upper surface of the device region. A pair of pull-down transistors are disposed in the device region and over the n-well. The pair of pull-down transistors have their respective gates coupled to a pair of complementary bitlines, respectively, and coupled to the n-well through the n-well contact region.

20 Claims, 8 Drawing Sheets

(56) References Cited

U.S. PATENT DOCUMENTS

| | | | |
|---|---|---|---|
| 2013/0020644 A1* | 1/2013 | Horita | H01L 21/2652 |
| | | | 257/351 |
| 2014/0029359 A1 | 1/2014 | Kim | |
| 2016/0049189 A1 | 2/2016 | Lecocq et al. | |
| 2016/0111534 A1* | 4/2016 | Kumar | H01L 21/7624 |
| | | | 257/348 |

* cited by examiner

US 11,062,745 B2

FDSOI SENSE AMPLIFIER CONFIGURATION IN A MEMORY DEVICE

REFERENCE TO RELATED APPLICATION

This Application claims the benefit of U.S. Provisional Application No. 62/737,297, filed on Sep. 27, 2018, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. In order to read data from electronic memory, sense amplifier circuits have been developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
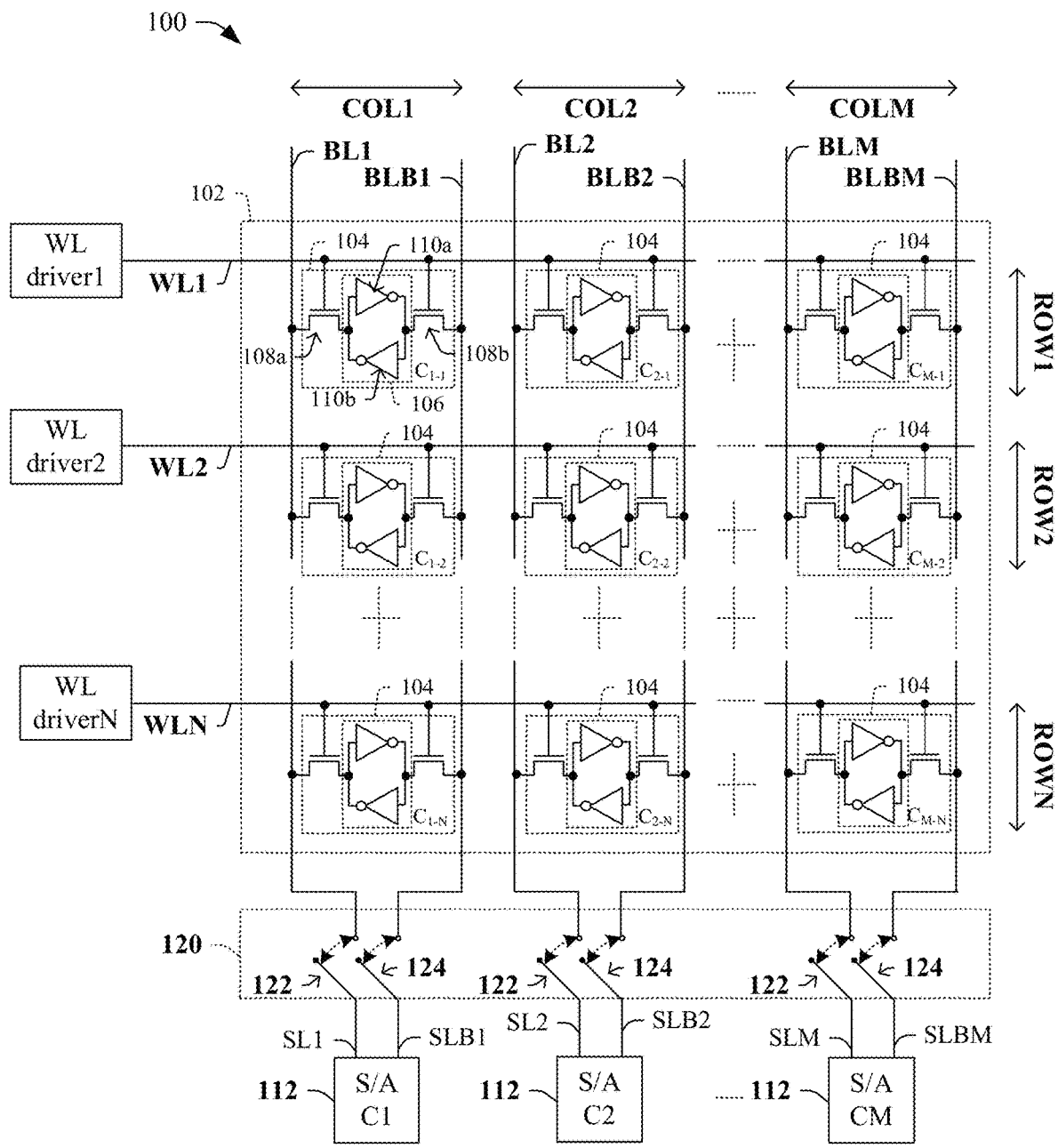
FIG. 1 illustrates a diagram depicting some embodiments of a memory device including an array of memory cells and one or more sense amplifiers to read data from the array.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides techniques for reading memory cells of a memory device. Some embodiments of the present disclosure make use of a fully depleted silicon on insulator (FDSOI) substrate for memory cells. To achieve faster read operations, a sense amplifier of the memory device includes pull-up transistors and pull-down transistors which are disposed over different well regions. The gates of the pull-down transistors are coupled to the body regions of the pull-down transistors to achieve faster read operations than previous approaches.

FIG. 1 illustrates a memory device 100 that includes a memory array 102 including a number of static random access memory (SRAM) cells 104. Within the memory array 102, the SRAM cells 104 are arranged in M columns (bits) and N rows (words) and are labeled $C_{COLUMN-ROW}$ in FIG. 1. Wordlines (WL) extend along respective rows, and complementary bitline pairs (each pair including a bitline (BL) and complementary bitline (BLB)) extend along respective columns. Though FIG. 1 illustrates an example where each memory cell is a SRAM cell, it will be appreciated that the disclosure is applicable to any differential memory cell that outputs complementary data states to BL and BLB, and can include single port memory cells or multiple port memory cells.

Each SRAM cell 104 includes a data storage element 106 and a pair of access transistors 108a, 108b. The data storage element 106 includes a pair of inverters 110a, 110b, which are cross-coupled to establish a pair of complementary data storage nodes. For convenience, these elements of the SRAM cell 104 are labeled only for SRAM cell C1-1 in FIG. 1, though other SRAM cells 104 have the same elements. The pair of access transistors 108a, 108b couple the complementary data storage nodes of the SRAM cells 104 along a column to the bitline BL and complementary bitline BLB, respectively, of that column. For example, in Row 1 of the memory device 100, the cells $C_{1-1}$ through $C_{M-1}$ form an M-bit data word accessible by activation of wordline WL1. Thus, when WL1 is activated, a first data state can be written to or read from SRAM cell $C_{1-1}$ through BL1 and BLB1; a second data state can be written to or read from SRAM cell $C_{2-1}$ through BL2 and BLB2; . . . ; and an Mth data state can be written to or read from SRAM cell $C_{M-1}$ through BLM and BLBM.

For example, during a typical write operation to Row 1, a voltage $V_{w1}$ is applied to a wordline WL1, wherein the $V_{w1}$ is typically greater than or equal to a threshold voltage of the access transistors (e.g., 108a, 108b), thereby turning on the access transistors within Row 1 and coupling the bitlines BL1, BLB1 through BLM, BLBM to the complementary storage nodes of the cross-coupled inverters of the accessed SRAM cells (e.g., SRAM cells $C_{1-1}$ through $C_{M-1}$). While the wordline WL1 is asserted, suitable voltages are applied to the bitlines BL1, BLB1 through BLM, BLBM to write desired data states to the accessed SRAM cells (e.g., SRAM cells $C_{1-1}$ through $C_{M-1}$). The voltage on each bitline is representative of a data value to be written to the accessed SRAM cell attached to that bitline. For example, if the value of "01 . . . 0" is to be written to Row 1, the BL1 can carry a low voltage, BL2 can carry a high voltage, . . . , and BLM can carry a low voltage to write the desired values to the accessed cells. While Row 1 is accessed, the wordlines of the other rows (WL2-WLN) remain below the threshold voltage of the access transistors 108a, 108b, such that the cross-coupled inverters of the other SRAM cells (e.g., SRAM cells $C_{1-2}$ through $C_{M-N}$) remain isolated and are not written to or read from.

To allow for read operations, each column also has a sense amplifier 112 that is used to detect a stored data state from an accessed SRAM cell of the column. Each sense amplifier 112 has a first input/output terminal corresponding to a sense line (SL), which is selectively coupled to a BL through a first switching element 122 of selection circuit 120. Each sense amplifier also has a second input/output terminal corresponding to a complementary sense line (SLB), which is selectively coupled to a complementary bitline BLB through a second switching element 124 of selection circuit 120. For example, when WL1 is activated (other WLs are deactivated), the SRAM cells $C_{1-1}$ through $C_{M-1}$ drive differential biases onto the complementary bitline pairs (BL1, BLB1 through BLM, BLBM, respectively), wherein the biases correspond to the respective data states stored in the accessed memory cells. The sense amplifiers 112 (S/A C1 through S/A CM, respectively) are then selectively coupled to the bitlines BLs and complementary bitlines (BLB) through the selection circuit 120 to detect the data states stored in the accessed SRAM cells.

Figure 2A:
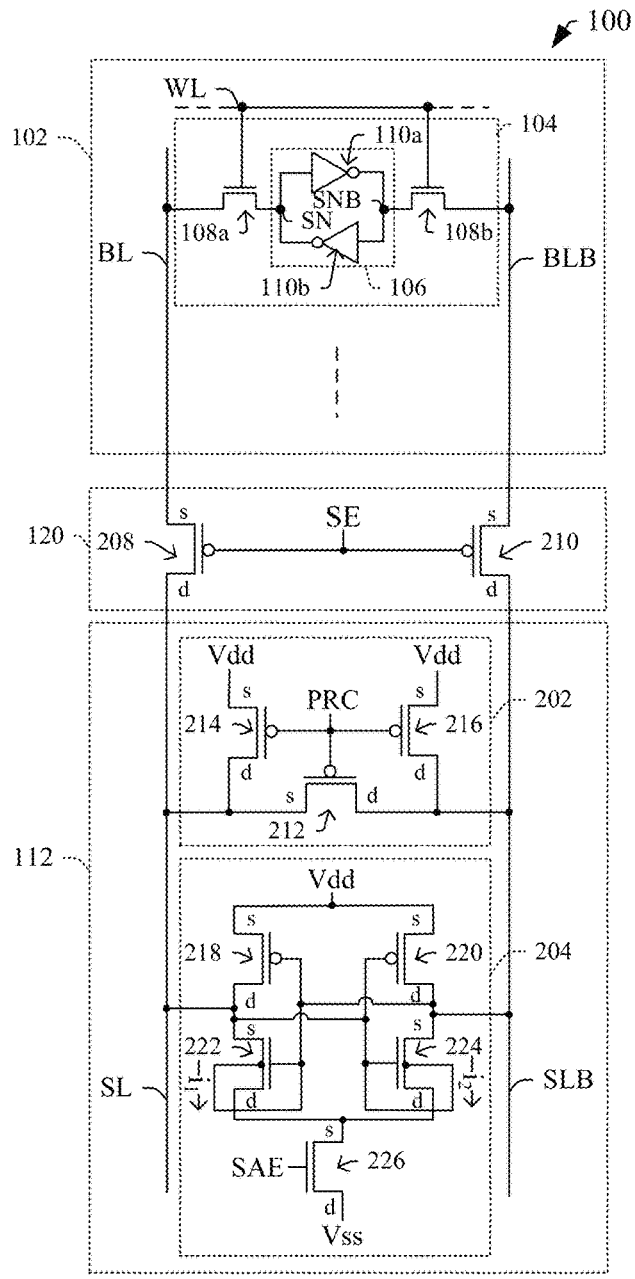
FIG. 2A illustrates a circuit schematic for some embodiments of a data path that can be used in the memory device of FIG. 1.

FIG. 2A illustrates a schematic view of a portion of the memory device 100 in more detail. The illustrated portion in FIG. 2A corresponds to a single column of the memory device 100 of FIG. 1, and includes a portion of the memory array 102, and a sense amplifier 112, and selection circuit 120. The sense amplifier 112 includes a pre-charge circuit 202 and a differential sensing circuit 204. For clarity, the illustrated portion of the memory device 100 is illustrated with only a single SRAM cell 104, though it will be appreciated that additional memory cells can be arranged in parallel with the illustrated SRAM cell 104 along BL and BLB consistent with FIG. 1.

The selection circuit 120 is configured to selectively couple sense line (SL) and complementary sense line (SLB) of the sense amplifier 112 to BL and BLB, respectively, of the memory array 102. The selection circuit 120 includes a first switching element 208 (e.g., first switching element 122 of FIG. 1) and a second switching element 210 (e.g., second switching element 124 of FIG. 1). The first switching element 208 couples SL to BL based on a sense enable (SE) signal; and the second switching element 210 concurrently couples SLB to BLB based on the SE signal. In FIG. 2A's example, the first and second switching elements 208, 210 manifest as PMOS transistors, though in other embodiments could manifest as NMOS transistors, BJTs, or other switching elements.

The pre-charge circuit 202 is configured to place a predetermined amount of charge on the SL and SLB prior to coupling SL and SLB to BL and BLB, respectively. The pre-charge circuit 202 comprises a third switching element 212 that selectively couples SL to SLB based on a pre-charge (PRC) signal. Fourth and fifth switching elements 214, 216 selectively couple VDD to SL and SLB, respectively. In FIG. 2A's example, the third, fourth, and fifth switching elements 212, 214, 216 manifest as PMOS transistors, though in other embodiments could manifest as NMOS transistors, bipolar junction transistors (BJTs), or other switching elements.

The differential sensing circuit 204 has a first input/output terminal corresponding to SL and has a second input/output terminal corresponding to SLB. The differential sensing circuit 204 includes a pair of p-type pull-up transistors 218, 220 and a pair of n-type pull-down transistors 222, 224. The first pull-up transistor 218 is arranged in series with the first pull-down transistor 222 to establish a first inverter, and the second pull-up transistor 220 is arranged in series with the second pull-down transistor 224 to establish a second inverter. The first and second inverters are cross-coupled, such that the input of the first inverter is coupled to an output of the second inverter, and the input of the second inverter is coupled to an output of the first inverter. In this way, the first and second inverters mutually reinforce the data states read from in the data storage element 106. A sense amplifier enable (SAE) transistor 226 enables/disables current flow through the differential sensing circuit 204 based on the SAE signal.

In some embodiments, the speed of a read operation can be attributed to the ability of the first and second pull-down transistors 222, 224 to conduct currents $i_1$, $i_2$, respectively, to quickly pull-down SL or SLB. Thus, the faster that the first and second pull-down transistors 222, 224 can pull SL or SLB to ground, the faster the read operation can be carried out.

In some embodiments, the first and second pull-down transistors 222, 224 have their respective gates coupled to one or more n-wells, as well as to SLB and SL, respectively. When the first and second pull-down transistors 222, 224, the first and second pull-up transistors 218, 220, and the switching transistors 208, 210, 212, 214, 216, and 226 are all disposed within the n-well; the transistors 222, 224 and 226 can exhibit a lower voltage threshold, and hence a larger on current ($i_{on}$), when the memory device 100 is disposed on a fully depleted silicon on insulator (FDSOI) substrate. Thus, when the first and second pull-down transistors 222, 224, the first and second pull-up transistors 218, 220, and the switching transistors 208, 210, 212, 214, 216, and 226 are all disposed within the one or more n-wells; the current i1 or i2 which pulls down SL or SLB tends to be larger to achieve a faster read operation.

Figure 2B:
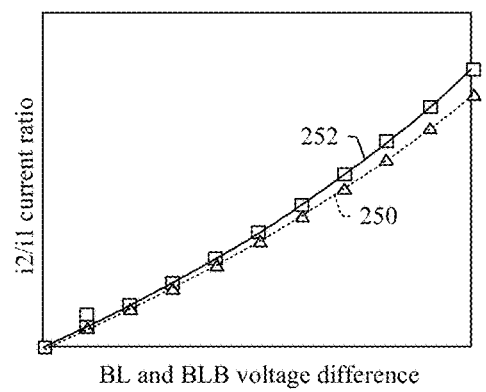
FIG. 2B illustrates a chart plotting a current ratio i2/i1 versus a voltage difference between a bitline (BL) and complementary bitline (BLB).

Moreover, the present disclosure further appreciates that first and second pull-down transistors 222, 224 can pull SL or SLB to ground more quickly if the gates of the first and second pull-down transistors 222, 224 are tied to the n-well. In other words, the gates of the first and second pull-down transistors 222, 224 are coupled to the bodies of the first and second pull-down transistors 222, 224 to implement a body bias scheme that achieves faster read operations than previous approaches. This is because during a typical read operation of SRAM cell 104, when a voltage difference ΔV between BL and BLB starts to build up, a ratio between i2 and i1 gets gradually larger. This is because the bodies of the first and second pull-down transistors 222, 224 are tied to the gates of the first and second pull-down transistors 222, 224. Compared to an approach where the bodies of the first and second pull-down transistors 222, 224 are tied to VDD, the voltage threshold of the first or second pull-down transistors 222 or 224 increases as the voltage difference ΔV develops, which is turn reduces i1 and increases the i2/i1 ratio. The increased i2/i1 ratio will speed the sensing operation, allowing for faster read operations. FIG. 2B shows a chart with two curves 250, 252 illustrating an example of this point. A first curve 250 shows the i2/i1 current ratio is smaller (which corresponds to slower read operations) when the bodies of the first and second pull-down transistors 222, 224 are tied to VDD; whereas a second curve 252 shows the i2/i1 current ratio is larger (which corresponds to faster read operations) when the bodies of the first and second pull-down transistors 222, 224 are tied to their gates.

Figure 3:
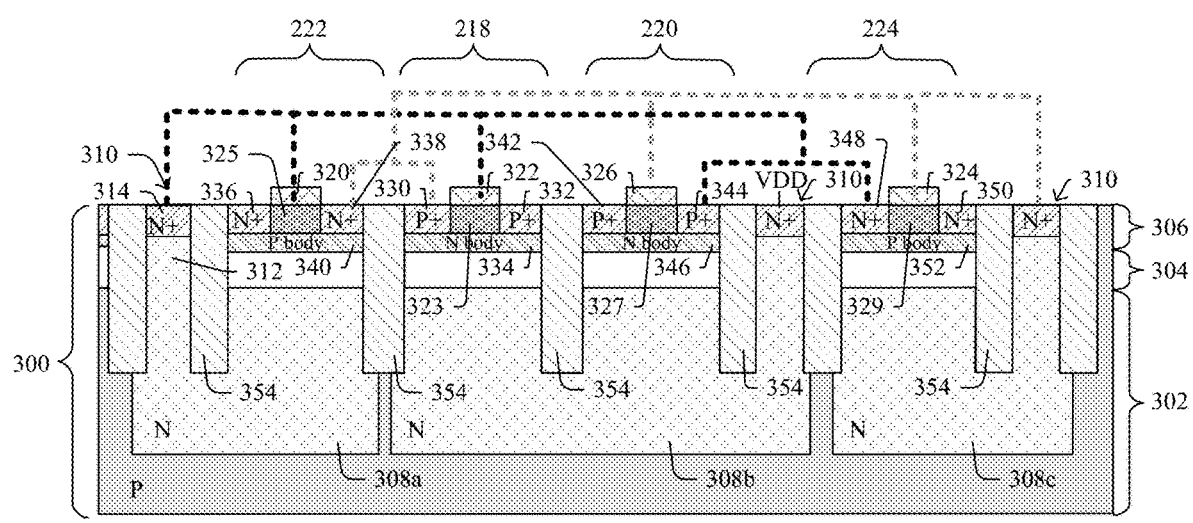
FIG. 3 illustrates a cross-sectional view illustrating some embodiments of a memory device on an FDSOI substrate.

FIG. 3 illustrates a cross-sectional view of some embodiments of a portion of the differential sensing circuit 204 that includes a first pull-up transistor 218, a first pull-down transistor 222, a second pull-up transistor 220, and second pull-down transistor 224.

The first pull-up transistor 218, first pull-down transistor 222, second pull-up transistor 220, and second pull-down transistor 224 are disposed on a fully-depleted silicon on insulator (FDSOI) substrate 300. The FDSOI substrate 300 includes a handle substrate region 302; an insulator layer 304 over the handle substrate region 302; and a semiconductor device region 306 over the insulator layer 304. In various embodiments, the FDSOI substrate 300 has a sufficiently thin semiconductor device region 306, such that during operation of the memory cell, the depletion region in the channel region of the transistors of the memory cell extend fully across the depth of the semiconductor device region 306. For example, in various embodiments, the semiconductor device region 306 is a monocrystalline silicon layer having a thickness ranging from 5 nm to 40 nm, and being approximately 10 nm to 12 nm thick in some cases; and the insulator layer 304 is a silicon dioxide or sapphire layer having a thickness ranging from 10 nm to 60 nm, and being approximately 25 nm thick in some cases, which can provide FDSOI functionality. In contrast, a partially depleted SOI (PDSOI) substrate has a semiconductor device layer that is thicker than that of a FDSOI substrate so the depletion region of a transistor extends only partially through the semiconductor device region 306 in the PDSOI substrate (e.g., through less than 100% of the thickness of the semiconductor device region in the PDSOI substrate).

A number of n-well regions 308 (e.g., 308a, 308b, 308c) are disposed in the handle substrate region 302, and n-well contact regions 310 extend through the insulator layer 304 to an upper surface of the device region. The n-well contact regions 310 each can include a pillar-like region 312 having the same dopant concentration as that of the n-well region 308, and a more highly doped n-well contact region 314 in the device region 306.

The first pull-up transistor 218 is disposed in the device region 306 and over the n-well 308b in the handle substrate 302. The first pull-down transistor 222 is disposed in the device region 306 and over the n-well 308a in the handle substrate 302, and is not disposed over a p-well. The first pull-up transistor 218 and first pull-down transistor 222 have their respective gates coupled to the n-well 308a through the n-well contact region and coupled to SLB, respectively. The first pull-up transistor 218 and first pull-down transistor 222 have gates that are tied together to establish a first inverter, consistent with FIG. 2A's embodiment.

The second pull-up transistor 220 is disposed in the device region 306 and over the n-well 308b in the handle substrate 302. The second pull-down transistor 224 is disposed in the device region 306 and over the n-well 308c in the handle substrate 302, and is not disposed over a p-well. The second pull-down transistor 224 and second pull-up transistor 220 have their respective gates coupled to the n-well 308c through the n-well contact region 310 and coupled to SL, respectively. The second pull-up transistor 220 and second pull-down transistor 224 have gates that are tied together to establish a second inverter, consistent with FIG. 2A's embodiment.

In some embodiments, the first and second inverters are coupled so as to establish a pair of cross-coupled inverters of the sense amplifier. The first pull-up transistor 218 comprises a first pull-up gate electrode 322 over the device region, first and second p-type source/drain regions 330/332 on opposite sides of the first pull-up gate electrode and over the insulator layer 304, and a first n-type (or intrinsic) body region 334 under the first pull-up gate electrode 322 and separating the first and second p-type source/drain regions 330, 332 from one another. A gate dielectric structure 323 separates the first pull-up gate electrode 322 from the first n-type (or intrinsic) body region 334.

The first pull-down transistor 222 is arranged in series with the first pull-up transistor 218 to establish a first inverter. The first pull-down transistor 222 comprises a first pull-down gate electrode 320 over the device region 306, first and second n-type source/drain regions 336, 338 on opposite sides of the first pull-down gate electrode 320 and over the insulator layer 304, and a first p-type (or intrinsic) body region 340 under the first pull-down gate electrode 320 and separating the first and second n-type source/drain regions 336, 338 from one another. A gate dielectric structure 325 separates the first pull-down gate electrode 320 from the first p-type (or intrinsic) body region 340.

The second pull-up transistor 220 includes a second pull-up gate electrode 326 over the device region, third and fourth p-type source/drain regions 342, 344 on opposite sides of the second pull-up gate electrode 326 and over the insulator layer 304, and a second n-type (or intrinsic) body region 346 under the second pull-up gate electrode 326 and separating the third and fourth p-type source/drain regions 342, 344 from one another. A gate dielectric structure 327 separates the second pull-up gate electrode 326 from the second n-type (or intrinsic) body region 346.

A second pull-down transistor 224 is arranged in series with the second pull-up transistor 220 to establish a second inverter that is cross-coupled with the first inverter. The second pull-down transistor 224 includes a second pull-down gate electrode 324 over the device region, third and fourth n-type source/drain regions 348, 350 on opposite sides of the second pull-down gate electrode 324 and over the insulator layer 304, and a second p-type (or intrinsic) body region 352 under the second pull-down gate electrode 324 and separating the third and fourth n-type source/drain regions 348, 350 from one another. A gate dielectric structure 329 separates the second pull-down gate electrode 324 from the second p-type (or intrinsic) body region 352. The n-well 308 in the handle-substrate extends under the insulator layer 304 continuously beneath the first and second pull-up transistors 218, 220.

The first pull-down transistor 222 has a first pull-down gate 320 coupled to the first pull-up gate 322 of the first pull-up transistor 218, and the first pull-down gate 320 and the first pull-up gate 322 are shorted to the n-well 308a. The second pull-down transistor 224 has a second pull-down gate 324 coupled to the second pull-up gate 326 of the second pull-up transistor 220, and the second pull-down gate 324 and the second pull-up gate 326 are shorted to the n-well 308c.

Figure 4:
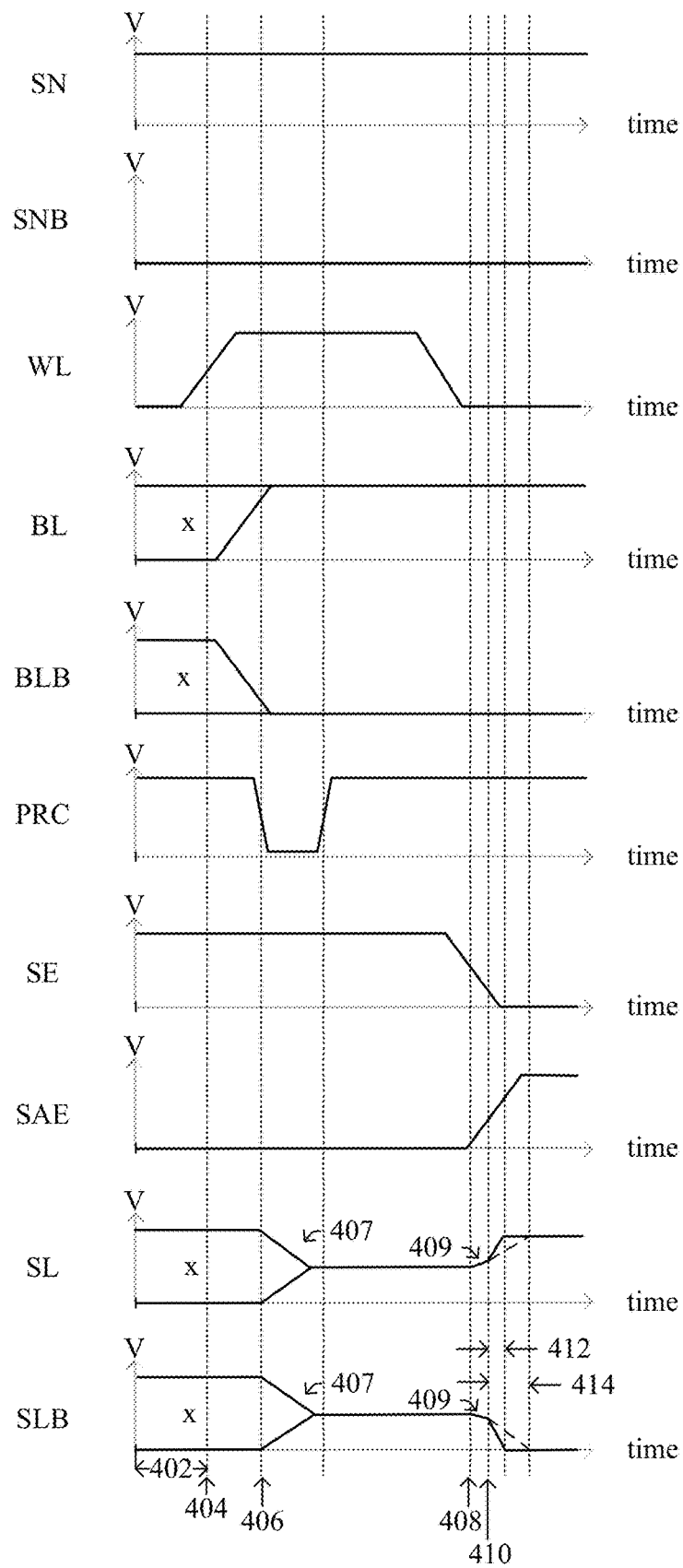
FIG. 4 illustrates timing diagrams depicting some embodiments of read operations for a memory device, such as the memory device shown in FIGS. 2A-2B and FIG. 3.

Referring now to FIG. 4, a description of some embodiments of how the portion of the memory device of FIGS. 2-3 can operate during read operations is provided with regards to a timing/waveform diagram. FIG. 4 shows waveforms for a read operation on a SRAM cell (FIG. 1-2, 104).

During time 402, the SRAM cell is in a first state (e.g., a logical "0" state). Thus, during this first state, storage node SN is driven to a high voltage, and complementary storage node SNB is correspondingly driven to a low voltage. Thus, the first and second inverters in the SRAM cell mutually reinforce this first state to retain the data stored in the SRAM cell.

At time 404, the wordline is driven high, coupling storage nodes SN to BL and SNB to BLB. Thus, at this time, the cross-coupled inverters build charge on the BL and BLB to correspond to the data state stored in the SRAM cell. In the illustrated example, BL is driven high, and BLB is driven low. To limit capacitance, the first and second switches (e.g., 122, 124 of FIG. 1) of the selection circuit are typically open during time 402, such that BL, BLB are isolated from SL, SLB.

At time 406, the pre-charge signal (PRC) is asserted for a predetermined time, which induces transfer of a predetermined amount of charge onto SL, SLB. Thus, SL and SLB are set to a pre-charge voltage (see 407), which lies between VSS and VDD. By SL and SLB being set to this pre-charge voltage, the differential sensing circuit (e.g., 204 of FIG. 2A) is able to "flip" more quickly than if SL, SLB were at VDD or VSS. Thus, this pre-charge operation helps facilitate fast sensing operations by the differential sensing circuit.

After the sense lines are pre-charged, the select enable (SE) signal is asserted at 408, which enables the selection circuit and couples the bitlines BL, BLB to the sense lines SL, SLB. The amount by which the bitline voltages change depends upon the state of the SRAM cell 104 being accessed. To determine whether the state of the SRAM cell 104 being accessed is a "1" or a "0", the sense amplifier enable (SAE) signal is taken high, which enables current to flow through a differential sensing circuit, which manifests as a pair of cross-coupled inverters in FIG. 2A's example. At time 408, SAE is pulsed high and SE is pulsed low, thereby coupling BL to SL and BLB to SLB. This voltage difference between BL and BLB is provided to the input terminals of the differential sensing circuit 204. Because BL is in high voltage state and BLB is in low voltage state, SL is pulled up and SLB is pulled down gradually, as shown the dashed line at time 410. Compared to an approach where the bodies of the n-type pull-down transistors 222, 224 are tied to VDD, SL is pulled up and SLB is pulled down faster when bodies of the n-type pull-down transistors 222, 224 are tied to their gates, as shown the solid line at time 410. This is because when voltage difference between SL and SLB get larger, the body bias scheme enhances the n-type pull-down transistors 224 and weakens n-type pull-down transistors 222 gradually. Larger strength difference between n-type pull-down transistors 222, 224 leads to faster read operations.

FIGS. 5-10 depict a series of cross-sectional views that collectively show a method of manufacturing a memory device (e.g., structure of FIG. 3) in accordance with some embodiments.

Figure 5:
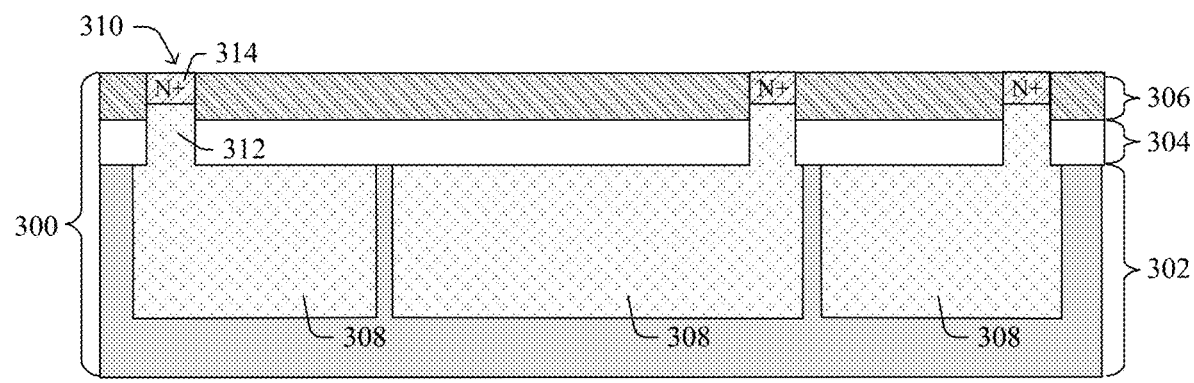
FIGS. 5-10 illustrate a series of cross-sectional views that collectively depict a method of manufacturing a memory device in accordance with some embodiments.

In FIG. 5, an SOI wafer is provided. The SOI wafer includes a handle layer 302, insulator layer 304, and a semiconductor device layer 306. The semiconductor device layer 306 includes an intrinsic semiconductor layer. A well region 308 is disposed in the handle layer 302 and a well contact region 310 extends from an upper surface of the device layer 306 through the insulator layer 304 to the well region 308. The well contact includes a highly doped region 314 (e.g., N+) near the upper surface of the device layer, and a pillar-like region 312 which can have the same doping concentration as the well region 308.

Figure 6:
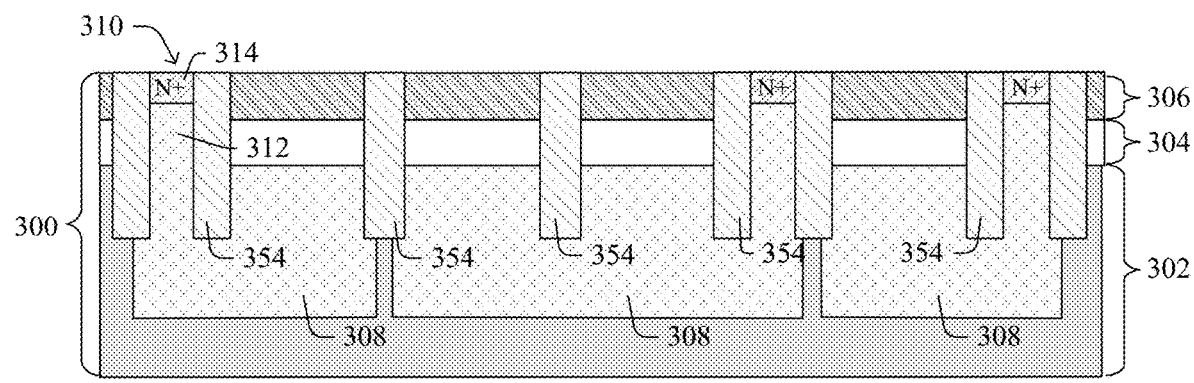

In FIG. 6, shallow trench isolation (STI) regions 354 are formed. The STI regions are formed by providing a first mask over the SOI substrate, and then etching trenches into the SOI substrate with the first mask in place. The trenches are then filled with a dielectric material, thereby forming the STI regions 354.

Figure 7:
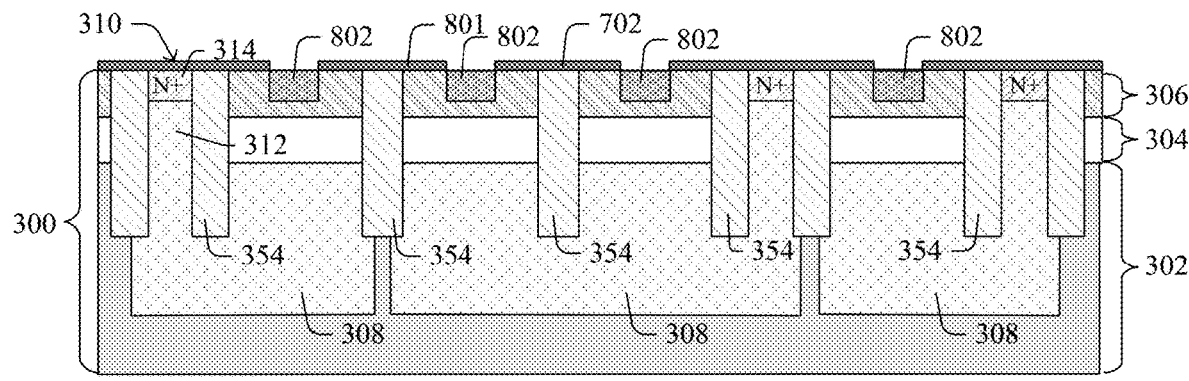

In FIG. 7, a second mask 702 is formed over the N+ and P+ regions, and a thermal oxidation is carried out to form gate dielectric structures 802. Each gate dielectric structure 802 can separate a source and drain region (to be formed in FIG. 8) from one another.

Figure 8:
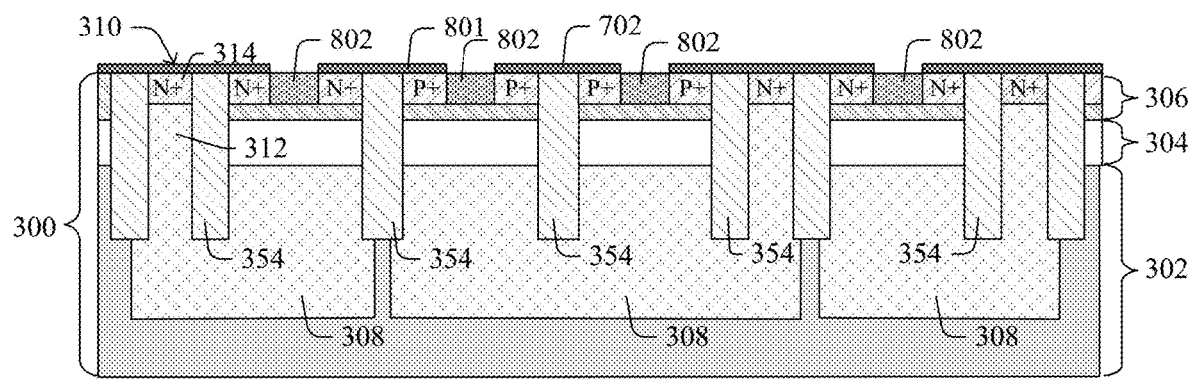

In FIG. 8, upper portions of the device layer 306 are doped N+ or P+. This can be achieved for example by forming a third mask that covers the N+ regions and leaves openings over the P+ regions, and then implanting p-type dopants with the third mask in place to form the P+ regions. Then, a fourth mask can be formed that covers the P+ regions and leaves openings over the N+ regions, and then implanting n-type dopants with the fourth mask in place to form the N+ regions. In some embodiments, the highly doped region 314 can be formed during this step rather than formed in FIG. 5. In some cases, a thin layer of intrinsic semiconductor material is left over the insulator layer 304. This intrinsic semiconductor material may act as the body of subsequently formed transistors. Thus, for FDSOI, there is no need to dope the body of the subsequently formed transistor, but rather only the N+ and P+ regions are doped to establish S/D regions.

Figure 9:
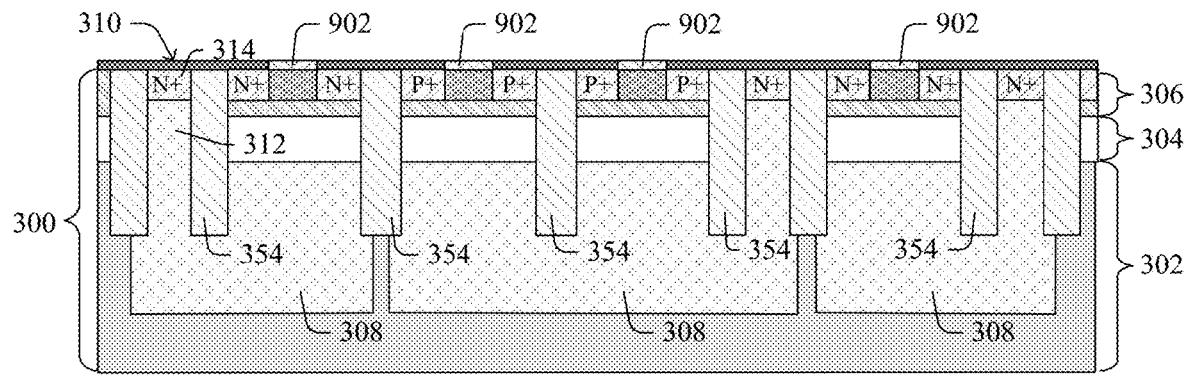

In FIG. 9, a conductive gate electrode 902 is formed over the gate oxide. For example, the conductive gate electrode 902 can be formed by sputtering, a CVD or PVD process to form a conformal conductive layer, and then a chemical mechanical planarization operation can be carried out to form individual gate electrodes that are aligned over the gate dielectric structures 802.

Figure 10:
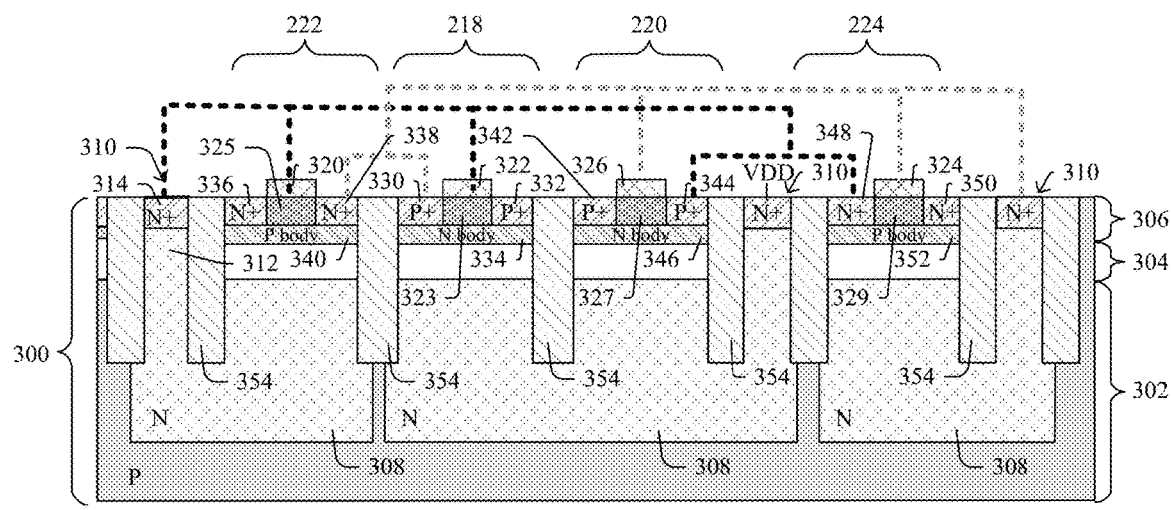

In FIG. 10, an interconnect structure including contacts, metal lines, and vias is formed over the SOI substrate to operably couple the devices as shown. Thus, FIG. 10 depicts a first pull-up transistor 218, a first pull-down transistor 222, a second pull-up transistor 220, and second pull-down transistor 224. The interconnect structure can be formed by forming a dielectric layer over the illustrated structure of FIG. 10, and then forming contact openings in the dielectric layer. A metal layer, such as nickel, titanium, or molybdenum for example, is then formed and a heat treatment is applied to form a silicide in the contacts opening on the upper surface of the substrate. Another metal, such as tungsten or aluminum for example is then formed to fill the contact openings, and metal lines/wires are formed over the contact openings. For example, the metal lines may be formed by a single damascene and/or dual damascene process, and may include multiple levels of interlayer dielectrics (e.g., ILD1, ILD2, ILD3, . . . ), and multiple metal line/wire layers (e.g., metal 1, metal 2, metal 3, . . . ), wherein via layers extend vertically through one or more ILD layers to electrically connect wires/lines of neighboring metal layers to one another. Often, the metal lines/wires and vias are made of copper, and a barrier liner layer separates the copper from the ILD layers, although other materials could also be used.

The first pull-up transistor 218 and first pull-down transistor 222 have their respective gates coupled to the n-well 308a through the n-well contact region and coupled to SLB, respectively. The first pull-up transistor 218 and first pull-down transistor 222 have gates that are tied together to establish a first inverter, consistent with FIG. 2A's embodiment.

The second pull-down transistor 224 and second pull-up transistor 220 have their respective gates coupled to the n-well 308c through the n-well contact region 310 and coupled to SL, respectively. The second pull-up transistor 220 and second pull-down transistor 224 have gates that are tied together to establish a second inverter, consistent with FIG. 2A's embodiment.

The first pull-down transistor 222 has a first pull-down gate 320 coupled to the first pull-up gate 322 of the first pull-up transistor 218, and the first pull-down gate 320 and the first pull-up gate 322 are shorted to the n-well 308a. The second pull-down transistor 224 has a second pull-down gate 324 coupled to the second pull-up gate 326 of the second pull-up transistor 220, and the second pull-down gate 324 and the second pull-up gate 326 are shorted to the n-well 308c.

Figure 11:
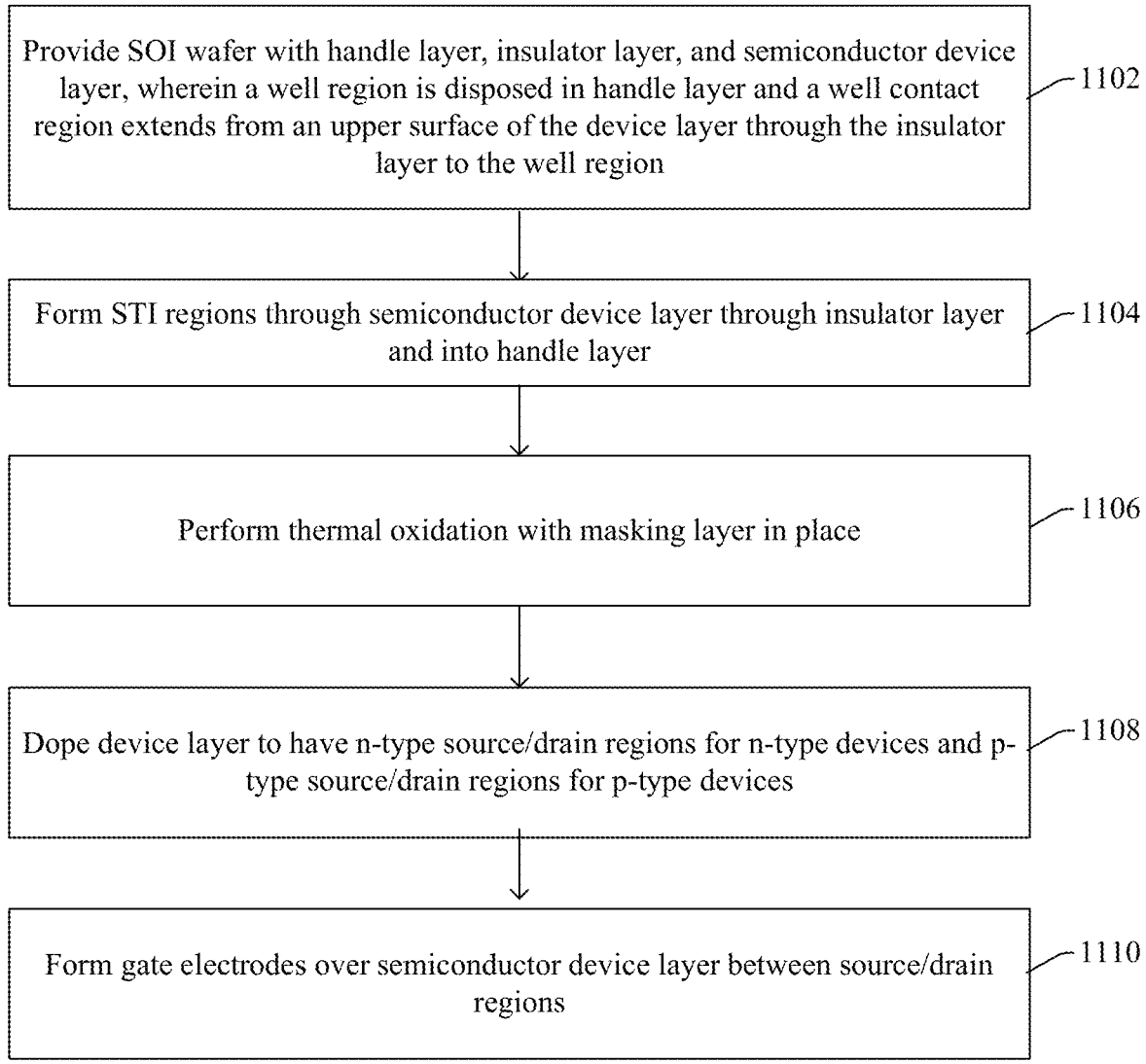
FIG. 11 illustrates a flowchart of some embodiments of a method of manufacturing a memory device in accordance with some embodiments.

FIG. 11 illustrates a flowchart of some embodiments of the method of manufacturing a memory device.

At 1102, an SOI wafer is provided. The SOI wafer includes a handle layer, an insulator layer over the handle wafer, and a semiconductor device layer over the insulator layer. A well region is disposed in the handle layer, and a well contact region extends from an upper surface of the device layer through the insulator layer to the well region. In some embodiments, 1102 can correspond, for example, to FIG. 5.

At 1104, STI regions are formed through semiconductor device layer through insulator layer and into handle layer. In some embodiments, 1104 can correspond, for example, to FIG. 6.

At 1106, a thermal oxidation is performed with masking layer in place to form gate dielectric structures. In some embodiments, 1106 can correspond, for example, to FIG. 7.

At 1108, the device layer is doped to have n-type source/drain regions for n-type devices and p-type source/drain regions for p-type devices. In some embodiments, 1108 can correspond, for example, to FIG. 8.

At 1110, a gate electrode is formed over the device layer, and between source/drain regions. In some embodiments, 1110 can correspond, for example, to FIG. 9.

While the flowchart 1100 of FIG. 11 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, some embodiments relate to a sense amplifier. The sense amplifier includes a fully-depleted silicon on insulator (FDSOI) substrate, including a handle substrate region, an insulator layer over the handle substrate region, and a device region over the insulator layer. An n-well region is disposed in the handle substrate region, and an n-well contact region extends from the n-well region through the insulator layer to an upper surface of the device region. A pair of pull-down transistors are disposed in the device region and over the n-well. The pair of pull-down transistors have their respective gates coupled to a pair of complementary bitlines, respectively, and coupled to the n-well through the n-well contact region.

Other embodiments relate to memory device. The memory device includes a memory array including a plurality of memory cells. A memory cell of the plurality of memory cells has a pair of complementary storage nodes that are coupled to a pair of complementary bitlines, respectively, through a pair of access transistors, respectively. The memory device also includes a sense amplifier. The sense amplifier includes a pair of input/output terminals that are coupled to the pair of complementary bitlines, respectively. The sense amplifier also includes a pair of cross-coupled inverters. The cross-coupled inverters include a pair of pull-up transistors and a pair of pull-down transistors. The pair of pull-down transistors have their respective gates coupled to the pair of complementary bitlines, respectively, and have their respective gates coupled to the well region.

Still other embodiments relate to a method for forming a memory device. In the method, a fully depleted semiconductor on insulator (FDSOI) wafer is provided. The FDSOI wafer includes a handle layer, an insulator layer over the handle layer, and a semiconductor device layer over the insulator layer. A well region is disposed in the handle layer, and a well contact region extends from an upper surface of the device layer through the insulator layer to the well region. A plurality of shallow trench isolation (STI) regions are formed, wherein the STI regions extend through the semiconductor device layer and through the insulator layer into the handle layer. A thermal oxidation is performed to oxidize first selected upper portions of the semiconductor device layer while leaving the well contact region unoxidized, thereby establishing gate dielectric structures. The gate dielectric structures reside over the well region and between two adjacent STI regions. Second selected upper portions of the semiconductor device layer are doped to provide n-type source/drain regions and p-type source/drain regions on opposites sides of the gate dielectric structures. A gate electrode is formed over the gate dielectric structures. An interconnect structure is formed to couple a gate electrode to the well contact region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a sense amplifier comprising:
      a fully-depleted silicon on insulator (FDSOI) substrate, comprising: a handle substrate region, an insulator layer over the handle substrate region, and a device region over the insulator layer;
      an n-well region comprising a plurality of n-wells disposed in the handle substrate region;
      an n-well contact region comprising a plurality of n-well contacts that extend from the n-well region through the insulator layer to an upper surface of the device region;
      a pair of pull-down transistors disposed in the device region and over the n-well region; and
      a pair of pull-up transistors disposed in the device region and over the n-well region,
      wherein a first n-well of the plurality of n-wells within the n-well region in the handle substrate region extends under the insulator layer continuously beneath the pair of pull-up transistors, and wherein the pair of pull-down transistors have their respective gates coupled to a pair of complementary bitlines, respectively, and coupled to the n-well region through the n-well contact region.

2. The memory device of claim 1,
wherein the pair of pull-up transistors and the pair of pull-down transistors are operably coupled to establish a pair of cross-coupled inverters of the sense amplifier.

3. The memory device of claim 1, wherein the pair of pull-up transistors and the pair of pull-down transistors comprise:
a first pull-up transistor comprising a first pull-up gate electrode over the device region, first and second p-type source/drain regions on opposite sides of the first pull-up gate electrode and over the insulator layer, and a first body region under the first pull-up gate electrode and separating the first and second p-type source/drain regions from one another; and
a second pull-up transistor comprising a second pull-up gate electrode over the device region, third and fourth source/drain regions on opposite sides of the second pull-up gate electrode and over the insulator layer, and a second body region under the second pull-up gate electrode and separating the third and fourth source/drain regions from one another.

4. The memory device of claim 3, further comprising:
a first pull-down transistor arranged in series with the first pull-up transistor to establish a first inverter, the first pull-down transistor comprising a first pull-down gate electrode over the device region, first and second n-type source/drain regions on opposite sides of the first pull-down gate electrode and over the insulator layer, and a first pull-down body region under the first pull-down gate electrode and separating the first and second n-type source/drain regions from one another; and
a second pull-down transistor arranged in series with the second pull-up transistor to establish a second inverter that is cross-coupled with the first inverter, the second pull-down transistor comprising a second pull-down gate electrode over the device region, third and fourth n-type source/drain regions on opposite sides of the second pull-down gate electrode and over the insulator layer, and a second pull-down body region under the second pull-down gate electrode and separating the third and fourth source/drain regions from one another; and
wherein the n-well region extends under the insulator layer continuously beneath the first and second pull-up transistors but is discontinuous before extending under the first and second pull-down transistors.

5. The memory device of claim 2:
wherein a first pull-down transistor of the pair of pull-down transistors has a first pull-down gate coupled to a first pull-up gate of a first pull-up transistor of the pair of pull-up transistors, and the first pull-down gate and the first pull-up gate are coupled to the first n-well of the plurality of n-wells within the n-well region; and
wherein a second pull-down transistor of the pair of pull-down transistors has a second pull-down gate coupled to a second pull-up gate of a second pull-up transistor of the pair of pull-up transistors, and the second pull-down gate and the second pull-up gate are coupled to a second n-well of the plurality of n-wells within the n-well region.

6. The memory device of claim 2, further comprising:
STI regions extending from the upper surface of the device region, through the insulator layer, and into the handle substrate region, wherein the STI regions laterally separate the pair of pull-up transistors from the pair of pull-down transistors.

7. The memory device of claim 1, wherein the n-well region is disposed within a p-type bulk region within the handle substrate region.

8. The memory device of claim 1, further comprising:
a memory array including a plurality of memory cells, wherein a memory cell of the plurality of memory cells has a pair of complementary storage nodes that are coupled to the pair of complementary bitlines, respectively, through a pair of access transistors, respectively;
wherein the sense amplifier comprises a pair of input/output terminals that are coupled to the pair of complementary bitlines, respectively, and further comprises a pair of cross-coupled inverters, wherein the pair of cross-coupled inverters include the pair of pull-up transistors and the pair of pull-down transistors.

9. The memory device of claim 8, wherein the memory array and the sense amplifier are disposed on the fully-depleted silicon on insulator (FDSOI) substrate.

10. The memory device of claim 9, wherein the n-well region comprises the first n-well of the plurality of n-wells disposed in the handle substrate region under a first pull-down transistor of the pair of pull-down transistors.

11. The memory device of claim 10, further comprising:
a second n-well of the plurality of n-wells disposed in the handle substrate region and spaced apart from the first n-well;
wherein the pair of pull-up transistors are disposed over the second n-well, and the second n-well is coupled to VDD.

12. The memory device of claim 11, wherein a second pull-down transistor of the pair of pull-down transistors is disposed over a third n-well of the plurality of n-wells.

13. The memory device of claim 9, further comprising a selection circuit, the selection circuit comprising:
a first switching element configured to selectively couple a first bitline of the pair of complementary bitlines to a first input/output terminal of the pair of input/output terminals based on a sense enable (SE) signal; and
a second switching element configured to selectively couple a second bitline of the pair of complementary bitlines to a second input/output terminal of the pair of input/output terminals based on the SE signal.

14. The memory device of claim 9, further comprising a pre-charge circuit configured to place a predetermined amount of charge on a pair of complementary sense lines, the pair of complementary sense lines coupling the pair of complementary bitlines to the pair of input/output terminals, respectively, wherein the pre-charge circuit comprises:
a third switching element configured to selectively couple the pair of complementary sense lines to one another based on a pre-charge (PRC) signal;
a fourth switching element configured to selectively couple a first sense line of the pair of complementary sense lines to VDD based on the PRC signal; and
a fifth switching element configured to selectively couple a second sense line of the pair of complementary sense lines to VDD based on the PRC signal.

15. The memory device of claim 9, further comprising:
STI regions extending from the upper surface of the device region, through the insulator layer, and into the handle substrate region, wherein the STI regions laterally separate the pair of pull-up transistors from the pair of pull-down transistors.

16. The memory device of claim 9, wherein the n-well region is formed within a p-type bulk region within the handle substrate region.

17. A memory device, comprising:
a sense amplifier comprising:
a fully-depleted silicon on insulator (FDSOI) substrate, comprising: a handle substrate region, an insulator layer over the handle substrate region, and a device region over the insulator layer;
an n-well region comprising a plurality of n-wells disposed in the handle substrate region;
an n-well contact region comprising a plurality of n-well contacts that extend from the n-well region through the insulator layer to an upper surface of the device region; and
a pair of pull-down transistors disposed in the device region and over the n-well region;
wherein the pair of pull-down transistors have their respective gates coupled to a pair of complementary bitlines, respectively, and coupled to the n-well region through the n-well contact region; and
a memory array including a plurality of memory cells, wherein a memory cell of the plurality of memory cells has a pair of complementary storage nodes that are coupled to the pair of complementary bitlines, respectively, through a pair of access transistors, respectively;
wherein the sense amplifier comprises a pair of input/output terminals that are coupled to the pair of complementary bitlines, respectively, and further comprises a pair of cross-coupled inverters, wherein the pair of cross-coupled inverters include a pair of pull-up transistors and the pair of pull-down transistors;
wherein the pair of pull-up transistors and the pair of pull-down transistors comprise:
a first pull-up transistor comprising a first pull-up gate electrode over the device region, first and second p-type source/drain regions on opposite sides of the first pull-up gate electrode and over the insulator layer, and a first body region under the first pull-up gate electrode and separating the first and second p-type source/drain regions from one another;
a second pull-up transistor comprising a second pull-up gate electrode over the device region, third and fourth source/drain regions on opposite sides of the second pull-up gate electrode and over the insulator layer, and a second body region under the second pull-up gate electrode and separating the third and fourth source/drain regions from one another; and
wherein a first n-well of the plurality of n-wells extends under the insulator layer continuously beneath the first pull-up transistor and the second pull-up transistor.

18. A memory device, comprising:
a sense amplifier comprising:
a fully-depleted silicon on insulator (FDSOI) substrate, comprising: a handle substrate region, an insulator layer over the handle substrate region, and a device region over the insulator layer;
a well region comprising a plurality of wells disposed in the handle substrate region;
a well contact region comprising a plurality of well contacts that extend from the first well region through the insulator layer to an upper surface of the device region; and
a pair of pull-down transistors disposed in the device region and over the well region;
wherein the pair of pull-down transistors have their respective gates coupled to a pair of complementary bitlines, respectively, and coupled to the well region through the well contact region,
wherein the well region comprises a first well of the plurality of wells disposed in the handle substrate region under a first pull-down transistor of the pair of pull-down transistors, and a second well of the plurality of wells disposed in the handle substrate region and spaced apart from the first well, and
wherein a pair of pull-up transistors are disposed over the second well, and the second well is coupled to VDD.

19. The memory device of claim 18, wherein the device region is a monocrystalline silicon layer having a thickness ranging from 5 nm to 40 nm.

20. The memory device of claim 18, wherein a second pull-down transistor of the pair of pull-down transistors is disposed over a third well of the plurality of wells.

* * * * *